United States Patent
Jeong et al.

(12) 
(10) Patent No.: US 6,381,077 B1
(45) Date of Patent: Apr. 30, 2002

(54) SCANNING MICROLITHOGRAPHIC APPARATUS AND METHOD FOR PROJECTING A LARGE FIELD-OF-VIEW IMAGE ON A SUBSTRATE

(75) Inventors: Hwan J. Jeong, Los Altos; David A. Markle, Saratoga, both of CA (US)

(73) Assignee: Ultratech Stepper, Inc., San Jose, CA (US)

( * ) Notice: Subject to any disclaimer, the term of this patent is extended or adjusted under 35 U.S.C. 154(b) by 0 days.

(21) Appl. No.: 09/543,609

(22) Filed: Apr. 5, 2000

(51) Int. Cl.$^7$ .................. G03B 27/42; G02B 17/00
(52) U.S. Cl. .................................... 359/726; 355/53
(58) Field of Search ........................ 359/726, 727, 359/728, 729, 732; 355/53

(56) References Cited

U.S. PATENT DOCUMENTS

| | | | |
|---|---|---|---|
| 3,951,546 A | 4/1976 | Markle | 355/51 |
| 4,011,011 A | 3/1977 | Hemstreet al al | 355/18 |
| 4,068,947 A | 1/1978 | Buckley et al. | 355/72 |
| 5,194,893 A | 3/1993 | Nishi | 355/53 |
| 5,281,996 A | 1/1994 | Bruning et al. | 355/77 |
| 5,298,939 A | 3/1994 | Swanson et al. | 355/33 |
| 5,585,972 A | 12/1996 | Markle | 359/732 |
| 5,815,245 A * | 9/1998 | Thomas et al. | 355/53 |
| 5,835,195 A | 11/1998 | Gibson et al. | 355/53 |
| 5,852,693 A | 12/1998 | Jeong | 385/47 |
| 6,031,597 A | 2/2000 | Knirck et al. | 355/53 |

OTHER PUBLICATIONS

David A. Markle *Submicron 1:1 Optical Lithography*, May 1986.
David A. Markle, A New Projection Printer, Jun. 1974, Solid State Technology, pp. 50–53
D. A. Markle, The future and Potential of Optical Scanning Systems, Sep. 1984, Solid State Technology, pp. 159–166.

* cited by examiner

*Primary Examiner*—Scott J. Sugarman
(74) *Attorney, Agent, or Firm*—Allston L. Jones

(57) ABSTRACT

A simple –1X, catadioptric projection relay system (e.g., a modified Wynne-Dyson relay) is combined with a linear scanning and object and image indexing systems to provide good imagery over a useful field which is two or more times wider than the field size of the projection system and arbitrarily long. The projection system has opposed and parallel object and image planes and produces an image in which object and image vectors in one direction are parallel and in a normal direction are opposed. The reticle and substrate are clamped and scanned together in the parallel direction and are indexed in the normal direction by equal and opposite amounts between scans. An example shows how a 2.5 micron resolution, i-line projection system with a 300 mm wide field could be used to expose a 550 mm wide substrate In two scans to yield a very high throughput.

24 Claims, 4 Drawing Sheets

SCANNING MICROLITHOGRAPHIC APPARATUS AND METHOD FOR PROJECTING A LARGE FIELD-OF-VIEW IMAGE ON A SUBSTRATE

BACKGROUND OF THE INVENTION

1. Field of the Invention

The present invention relates to a scanning micro-lithographic apparatus and method for projecting a large field-of-view image on a substrate and, more particularly, to such apparatus that preferably employs a wide-field catadioptric projection system (e.g., a projection system incorporating a Wynne Dyson optical relay).

2. Description of the Prior Art

Some micro-lithographic applications, like flat display panel manufacturing, require a fast, seamless, high-resolution (e.g., 2–3 micrometers), large area exposure. This kind of exposure can be achieved effectively by scanning the substrate under a large exposure projection system with a field-of-view for exposure.

It is well known that micro-lithography can be done over a large area by combining two -1X projection systems having parallel object and image planes with a raster scanning system that moves the mask and substrate together so as to produce one strip of imagery at a time. The precision requirements on the scanning system are relaxed if adjacent strips of imagery are not butted together, but overlapped in a small area containing a linear variation in exposure intensity, such as can be obtained using a tapered illumination slit. A micro-lithography approach employing this principle is described in U.S. Pat. No. 5,298,939 and its division U.S. Pat. No. 5,835,195, both of which are entitled "Method and Apparatus for Transfer of a Reticle Pattern onto a Substrate by Scanning". The drawback with this approach is that to obtain a +1X relay system it is either necessary to employ two -1X relays in series or to add an odd number of folds to the optical system which is often inconvenient or impossible. Also the requirements on the raster scanning system lead to substantial expense and complexity in the stage components.

An alternate approach, described in U.S. Pat. No. 5,585,972, entitled "Arbitrarily Wide Lens Array with an Image Field to Span the Width of a Substrate," employs an array of +1X projection systems, which span the width of the substrate, to reduce the scanning requirement to a single linear scan. The drawback with this approach is that it requires a great many projection optical systems all of which have to be aligned very accurately and the illumination apertures are a staggered array of rectangles which is difficult to illuminate uniformly.

Therefore, there is a need for a scanning microlithographic apparatus and method that derives a high-resolution, large area exposure over a large area with a greatly simplified projection and illumination optical system, while not introducing too much complexity in the scanning system. In this regard, the teachings of U.S. Pat. No. 5,852,693, entitled "Low-loss Light Redirection Apparatus" which discloses a uniform illumination system employing light guiding technology using multiple light-pipes, is incorporated herein by reference.

SUMMARY OF THE INVENTION

The present invention is directed to a scanning micro-lithographic apparatus that employs a fixed -1X projection system (preferably, a wide-field catadioptric projection system) having a limited field of view in which image patterns located in its object plane can be imaged onto a substrate located in its image plane. These patterns, which are contained on a reticle or mask, are wider than the limited field size of the projection system. The mask is illuminated over the area corresponding to the field of the projection system and is moved in the object plane reticle in a direction parallel to that in which a vector in the object plane would be imaged parallel to its image in the object plane. Synchronous motion of the substrate in the same direction, scanning, copies the pattern from the reticle onto the substrate. In this fashion, a strip of imagery spanning the length of the pattern on the reticle may be copied onto the substrate. Other strips of imagery may be added in subsequent scans but, because the magnification is -1X, it is necessary to re-register the reticle and substrate by stepping them equally in opposite directions normal to the scanning direction. A second synchronous scan of the reticle and substrate then results in a pattern exposed on the substrate that is congruent with the reticle pattern. Subsequent stepping and scanning operations can be used to copy an arbitrarily large pattern on a reticle to a similarly sized substrate using a -1X relay having a smaller field size than the reticle pattern.

BRIEF DESCRIPTION OF THE DRAWINGS

FIG. 2a is a diagrammatic showing in the horizontal plane of the movable mask structure shown in FIG. 1a;

DESCRIPTION OF THE PREFERRED EMBODIMENTS

Figure 1B:
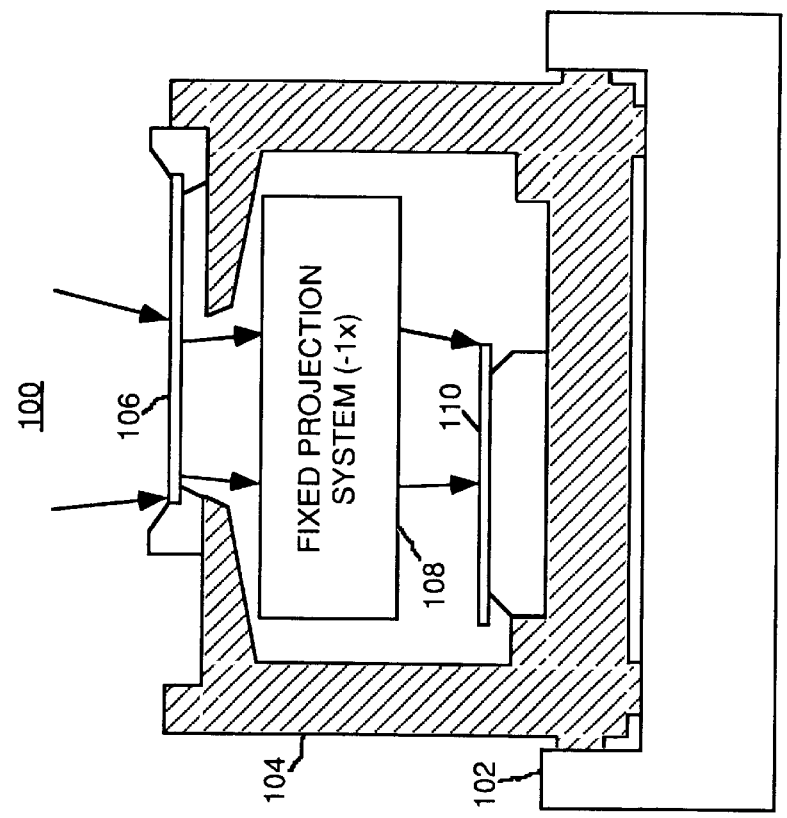
FIG. 1b is a diagrammatic showing in the vertical section through the scanning microlithographic apparatus of the present invention in which the movable mask structure and the movable substrate structure of this embodiment of the imaging means are each shown in a second of the two relative positions thereof with respect to the fixed -1X projection system of the imaging means.
Figure 1A:
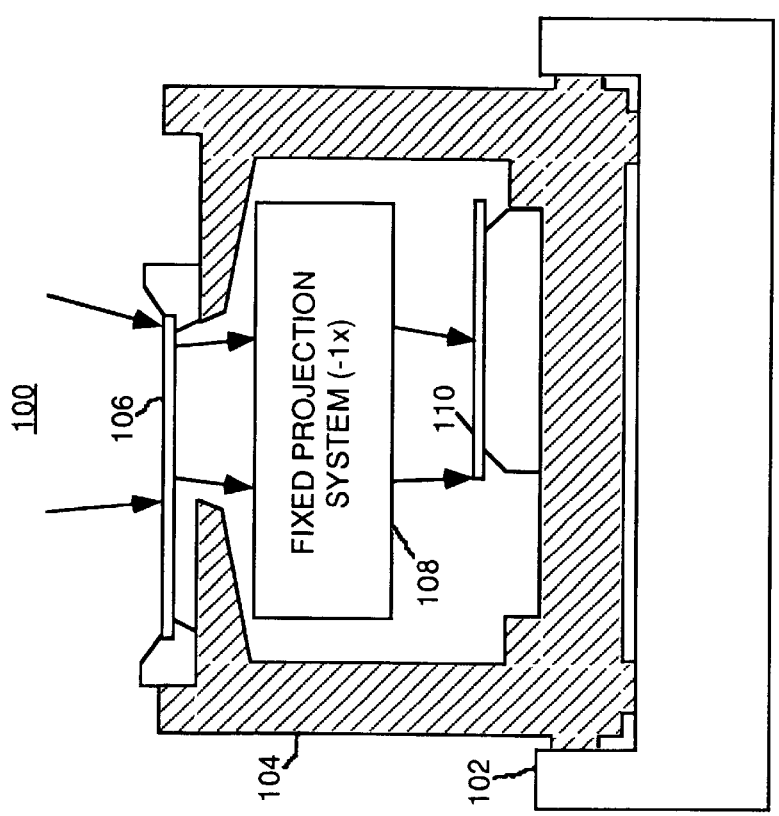
FIG. 1a is a diagrammatic showing in the vertical section through the scanning microlithographic apparatus of the present invention comprising an embodiment of an imaging means in which a movable mask structure and a movable substrate structure of the apparatus are each shown in a first of two relative positions thereof with respect to a fixed -1X projection system of the imaging means.

Scanning microlithographic apparatus 100 shown in each of FIGS. 1a and 1b comprises fixed base 102, scanning carriage 104, movable mask structure 106, fixed −1X projection system 108 and movable substrate structure 110.

In FIG. 1a, movable mask structure 106, supported by scanning carriage 104 toward the top thereof, is shown in its extreme left indexed position and movable substrate structure 110, supported by scanning carriage 104 toward the bottom thereof, is shown in its extreme right indexed position. In FIG. 1b, movable mask structure 106, supported by scanning carriage 104 toward the top thereof, is shown in its extreme right indexed position and movable substrate structure 110, supported by scanning carriage 104 toward the bottom thereof, is shown in its extreme left indexed position. Movable mask structure 106 and movable substrate structure 110 may be switched to either the indexed position thereof shown in FIG. 1a or the indexed position thereof shown in FIG. 1b by the operation of unshown indexing means (e.g., magnetic indexing means). When movable mask structure 106 and movable substrate structure 110 occupy their positions shown in FIG. 1a, they comprise elements of imaging means that results in light (indicated by arrows) illuminating the patterns defined by the right half of mask structure 106 to be imaged by fixed −1X projection system 108 on the left half of movable substrate structure 110. Similarly, when movable mask structure 106 and movable substrate structure 110 occupy their positions shown in FIG. 1b, they comprise elements of imaging means that results in light illuminating the patterns defined by the left half of mask structure 106 is imaged by fixed −1X projection system 108 on the right half of movable substrate structure 110.

In operation, both mask structure 106 and substrate structure 110 are carried on common scanning carriage 104 that moves on a fixed axis that is accurately aligned with the axis of projection system 108. The axis of projection system 108 is defined as the direction in which a vector in the object plane and its image in the image plane are parallel. The carriage is shown shaded in the figure and is guided by air bearings that operate against a fixed base 102 so that it is only free to move in the scanning direction.

Figure 1C:
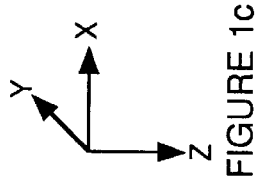
FIG. 1c indicates the respective directions of the 2 horizontal spatial coordinates X and Y and the vertical spatial coordinate Z with respect to the plane of the paper in which each of FIGS. 1a and 1b is shown.

As indicated in FIG. 1c, FIGS. 1a and 1b lie in an X, Z vertical plane that is parallel to the plane of the paper. Scanning carriage 104, mounted in fixed base 102 (e.g., by air bearings) and operated by motor means (e.g., a linear motor) is moved either forward or backward in the Y direction normal to the plane of the paper to effect a scan. Since movable mask structure 106 is supported by scanning carriage 104, such a scan results in the exposure of roughly half of the substrate by the half of mask structure 106 then being illuminated.

Figure 2A:
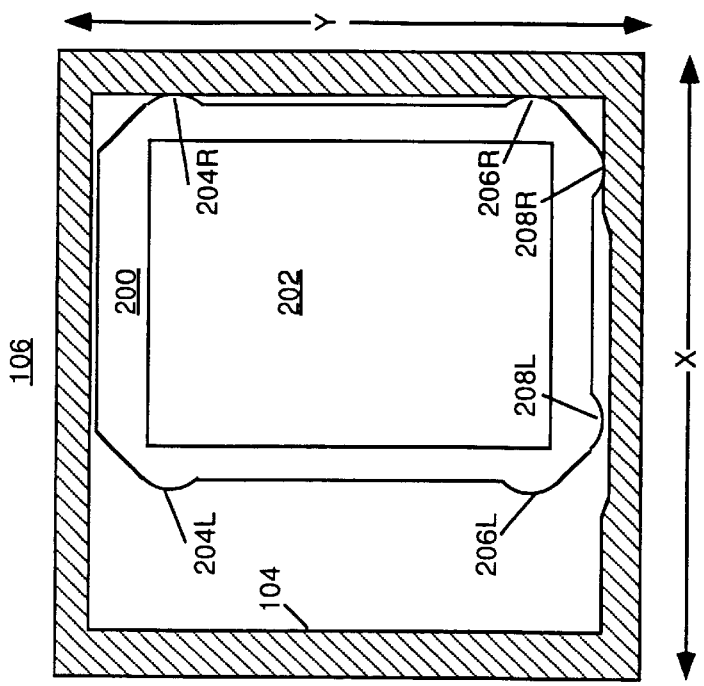
Figure 2B:
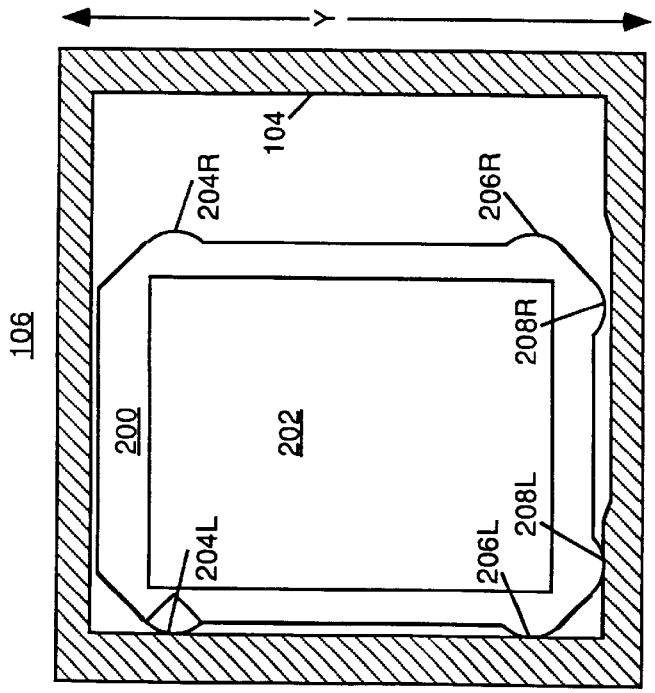
FIG. 2b is a diagrammatic showing in the horizontal plane of the movable mask structure shown in FIG. 1b.

FIGS. 2a and 2b, which, respectively, correspond in position to FIGS. 1a and 1b, show mask structure 106 in its X, Y horizontal plane. As indicated in detail in FIGS. 2a and 2b, mask structure 106 comprises mask holder 200 which holds mask 202. Mask 202 constitutes a reticle that defines the patterns which are to be imaged on a substrate included in substrate structure 110. As shown in the plane of the paper, projecting from the corners of mask holder 200 are the single upper-left prominence 204L, the single upper-right prominence 204R, the double lower-left prominences 206L and 208L and the double lower-right prominences 206R and 208R. When mask structure 106 occupies its first position shown in FIG. 2a, the prominences 204L, 206L and 208L are situated so that solely a first set of three points of mask holder 200 of mask structure 106 are in contact against edges of the left and lower interior edges of scanning carriage 104, thereby precisely controlling the position and the angular orientation of reticle 202 in the horizontal plane defined by the contact positions of the three points of this first set. Similarly, when mask structure 106 occupies its second position shown in FIG. 2b, the three prominences 204R, 206R and 208R are situated so that solely a second set of three points of mask structure 106 are in contact against edges of the right and lower interior edges of scanning carriage 104, thereby precisely controlling the position and the angular orientation of reticle 202 in the horizontal plane defined by the contact positions of the three points of this second set. The left and right interior edges of scanning carriage 104 are in precise parallel relationship with one another and unshown means comprising air bearings is employed in the support of mask structure 106 while (1) in its first position, (2) while in its second position and (3) while being moved between its first and second positions.

Although not shown in the drawing, the design of substrate structure 110 in FIGS. 1a and 1b is substantially similar to that of above-described mask structure 106 shown in FIGS. 2a and 2b to permit substrate structure 110, in its X,Y horizontal plane, to be moved from its first position to its second position and to be precisely angularly oriented when in its first position and also when in its second position. It is important that neither mask structure 106 nor substrate structure 110 rotate between index positions and that the index distance be the same for both.

Figure 3A:
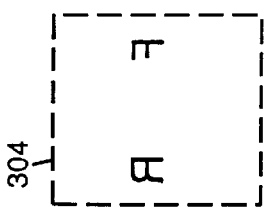
FIG. 3a illustrates the inverted image exposed on the substrate of spatial patterns disposed on the mask of the movable mask structure at the end of one complete exposure scanning cycle.
Figure 3:
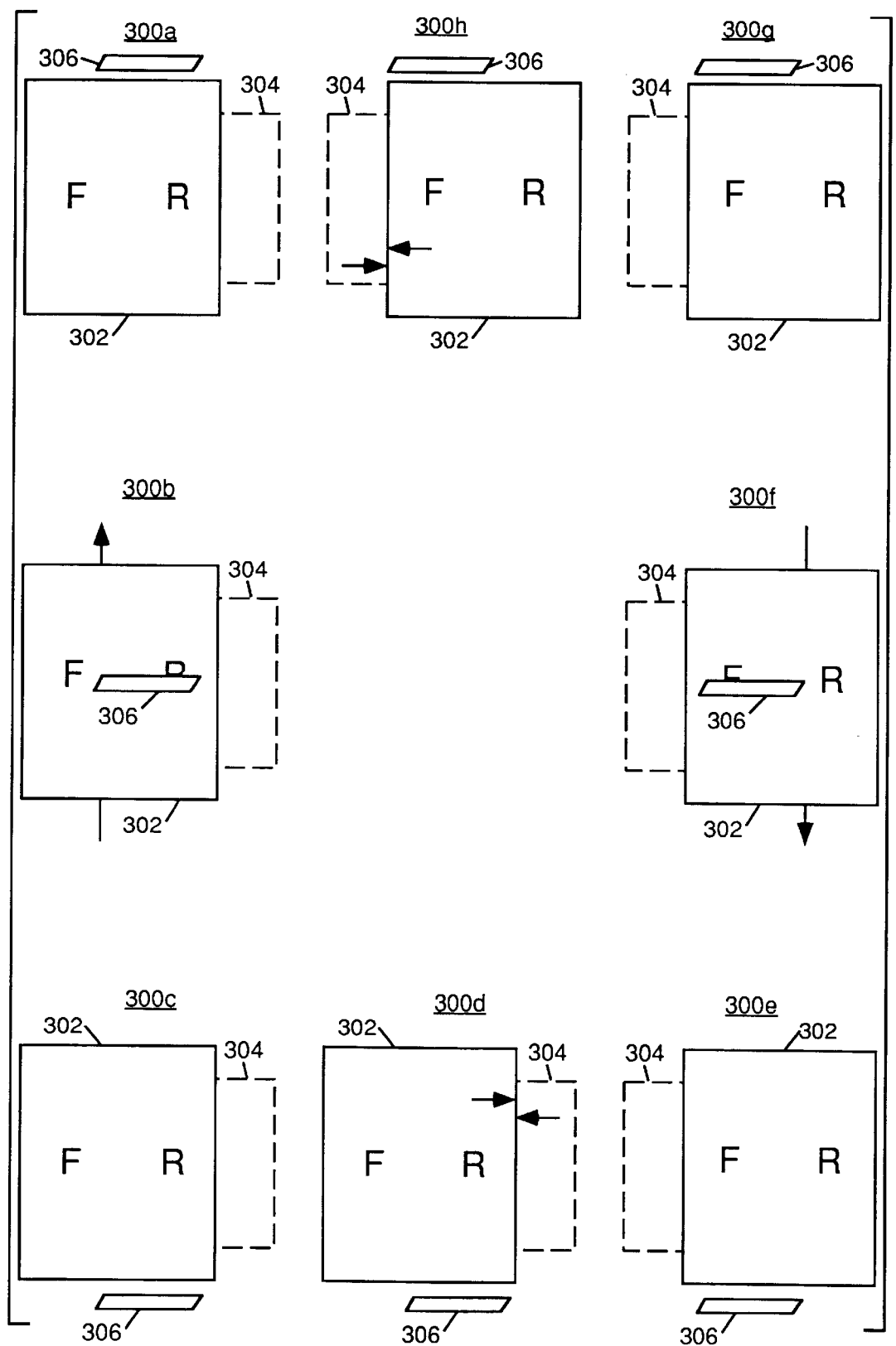
FIG. 3 diagrammatically illustrates the successive steps of one complete exposure scanning cycle of the movable mask structure and movable substrate structure of the imaging means of the scanning micro-lithographic apparatus incorporating present invention.

Referring now to FIG. 3, there is diagrammatically illustrated each of the successive 8 steps 300a to 300h of one complete exposure scanning cycle of reticle 302 of movable mask structure 106 and substrate 304 of movable substrate structure 110 with respect to the fixed position of illumination slit 306. The width of illumination slit 306 is substantially one-half the width of each of reticle 302 and substrate 304. The spatial patterns defined by reticle 302 are represented by the letter "F" situated in the left half of reticle 302 and the letter "R" situated in the right half of reticle 302.

Step 300a shows that prior to the beginning of a scanning cycle, reticle 302 and substrate 304 are disposed in their first positions and illumination slit 306 is situated in the plane of the paper above reticle 302 and substrate 304. Step 300b shows that during the first half of a scanning cycle, reticle 302 and substrate 304 are moved upward in the plane of the paper (as indicated by the direction of the arrow in 300b), thereby exposing the spatial patterns, such as the letter"R", situated on the right half of reticle 302. Step 300c shows that at the end of the first half of a scanning cycle, reticle 302 and substrate 304 are still disposed in their first positions and illumination slit 306 is situated in the plane of the paper below reticle 302 and substrate 304. Step 300d shows that next indexing takes place, wherein reticle 302 is to be switched from its first (i.e., left) position to its second (i.e., right) position and substrate 304 is to be switched from its first (i.e., right) position to its second (i.e., left) position (as indicated by the direction of the arrows in 300d). Step 300e shows that subsequent to such indexing and prior to the beginning of the second half of a scanning cycle, reticle 302 and substrate 304 are disposed in their second positions and illumination slit 306 is situated in the plane of the paper below reticle 302 and substrate 304. Step 300f shows that during the second half of a scanning cycle, reticle 302 and substrate 304 are moved downward in the plane of the paper (as indicated by the direction of the arrow in 300f), thereby exposing the spatial patterns, such as the letter "F", situated on the left half of reticle 302. Step 300g shows that at the end of the second half of a scanning cycle, reticle 302 and substrate 304 are still disposed in their second positions and illumination slit 306 is situated in the plane of the paper above reticle 302 and substrate 304. Step 300h shows that finally indexing takes place, wherein reticle 302 is to be switched from its second (i.e., right) position to its first (i.e., left) position and substrate 304 is to be switched from its second (i.e., left) position to its first (i.e., right) position (as indicated by the direction of the arrows in 300h). The accomplishment of this final indexing completes the performance of an entire scanning cycle.

FIG. 3a illustrates the inverted image exposed on substrate 304 of spatial patterns, represented by the letters "F" and "R", disposed on the reticle 302 at the end of one complete exposure scanning cycle.

Figure 4A:
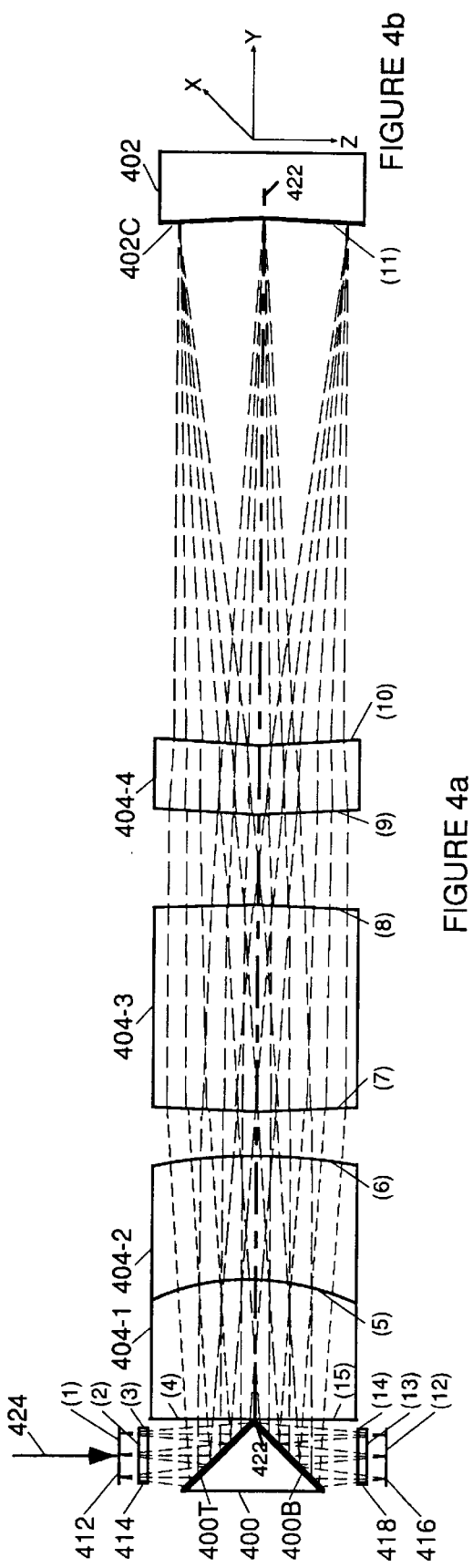
FIGS. 4a, 4b, 4c and 4d relate to a preferred embodiment of the imaging means shown in FIGS. 1a and 1b that employs a fixed -1X projection system comprising a design of a catadioptric optical system design employing a plurality of lenses defining a modified Wynne-Dyson relay.
Figure 4B:
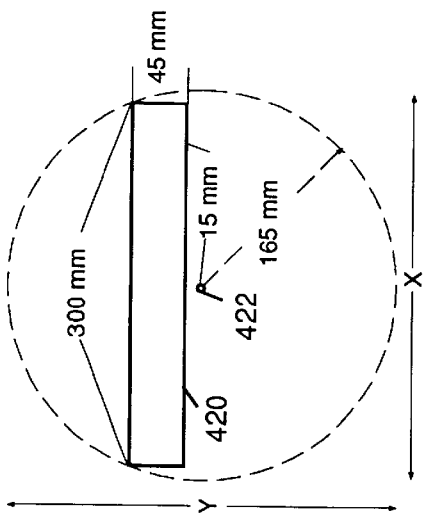
Figure 4C:
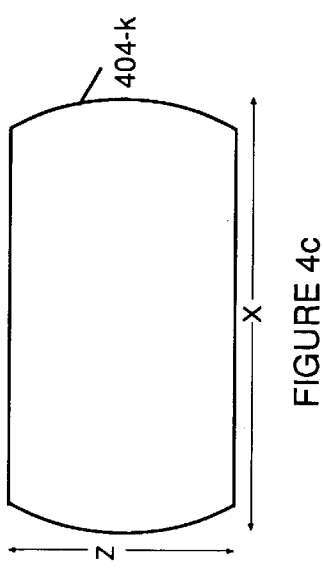
Figure 4D:
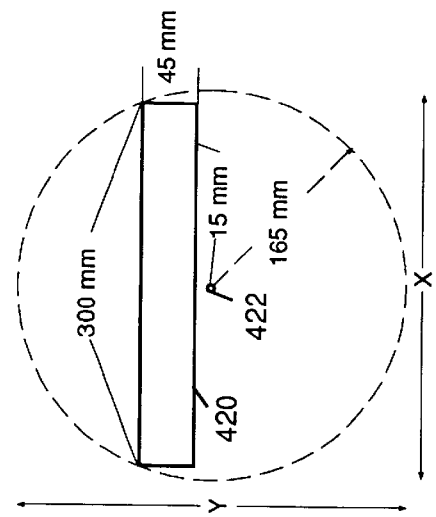

Reference is now made to FIGS. 4a, 4b, 4c and 4d, which show various indicated views of a preferred embodiment of the FIGS. 1a and 1b imaging means that includes a design for the fixed −1X projection system 108 which comprises a catadioptric optical system employing a plurality of lenses defining a modified Wynne-Dyson relay. More specifically, as indicated in FIGS. 4a and 4b, in the plane of the paper, shows a Y, Z-plane view through the optical axis of triangular fold-mirror element 400, reflector element 402 and the four lenses 404-1, 404-2, 404-3 and 404-4 (which constitute the structure of fixed −1X projection system 108) together with reticle 412, its protective window 414, substrate 416 and its protective window 418. Thus, as further indicated in FIG. 4b, the X direction in FIG. 4a is oriented normal to the plane of the paper. FIG. 4c shows the X, Z-plane view of the shape of the periphery of any one of lenses 404-1, 404-2, 404-3 and 404-4 (which is designated lens 404-k in FIG. 4c). FIG. 4d shows (1) the respective sizes of the X and Y dimensions of the substantially rectangular illumination field incident on reticle 412 (as well as the corresponding field imaged on substrate 416) and (2) the relative offset between the rectangular illumination field and the center of the field on projection lens 422. In the example shown in FIG. 4d the offset between the center of the field of the projection lens and the closest edge of the illuminated field is 15 mm, This offset avoids vignetting that would otherwise occur on the folding prism 400. In FIG. 4a the optical axis through the center of the lens would be folded by folding prism along the flat edge of lens element 404-1. The offset between the folded axis and the field is apparent in the Y separation distance between the piano surface of lens element 404-1 and the illuminated field shwon on the reticle plane 412.

More particularly, in the rectangular object field 420 shown in FIG. 4d, the size of the X dimension is 300 millimeters (mm) and the size of the Y dimension is 45 mm. Further, rectangular object field 420 is positioned so that its upper side would form a chord of a circle having a radius of 165 mm (i.e., 330 mm diameter) which is centered on optical axis position 422. This results, in the FIG. 4d view, in the lower side of rectangular object field 420 being situated substantially 15 mm above optical axis 422, which, in the FIG. 4a view, causes the left surface of lens 404-1 being situated 15 mm to the right of the right side of reticle 412.

While originally each of lenses 404-1, 404-2, 404-3 and 404-4 had a circular periphery somewhat larger than 300 mm in diameter, in accordance with the principles of this invention, a portion of both the top and bottom of these lenses has been sawed away. This results in the sawed periphery of each of these lenses having the shape of lens 404-k shown in FIG. 4c, which has a width in its X dimension which remains somewhat larger than 300 mm, but has a thickness in its Y dimension which (as shown in FIG. 4) may have been reduced to substantially one-half that of its X dimension. Sawing away the top and bottom portions of these lenses results in the dual advantages of both facilitating scanning of the reticle 412 and substrate 416 by aligning them parallel to each other, and reducing lens weight.

Returning to FIG. 4a, reticle 412, which defines the patterns to be imaged, lies in the object plane of the projection system. While reticle 412 is being scanned in the horizontal Y direction, illumination from above, which is directed in the vertical Z direction (as indicated by arrow 424), is incident on the reticle 412. The shape and relative position of this incident light with respect to the folded position of the projection system optical axis is that shown in FIG. 4d. The result is that light (indicated by dashed lines in FIG. 4a) passes downward in the vertical Z direction through reticle 412 and its protective window 114 and is incident on the top mirror surface 400T (indicated by a thick line) of triangular fold-mirror element 400. Top mirror surface 400T, which is oriented at a 45 degree angle with respect to each of the horizontal Y and vertical Z directions, reflects the vertical Z direction light incident thereon into the horizontal Y direction. This horizontal Y direction light, subsequent to being acted upon by each of lenses 404-1, 404-Z, 404-3 and-404-4 as it passes left-to right therethrough, is incident on concave-mirror surface 402C (indicated by a thick line) of reflector element 402. The horizontal Y direction light reflected from concave mirror surface 402C, subsequent to passing right-to-left back through each of lenses 404-4, 404-3, 404-2 and 404-1, is incident on the bottom mirror surface 400B (indicated by a thick line) of triangular fold-mirror element 400. Bottom mirror surface 400B, which is oriented at a 45 degree angle with respect to each of the horizontal Y and vertical Z directions, reflects the horizontal Y direction light incident thereon into the downward vertical Z direction through substrate protective window 418 to a focus on substrate 416, while substrate 416 is being scanned together with reticle 412 in the horizontal Y direction. Operating in this manner, the imaging means shown in FIG. 4a, is effective in imaging a −1X (i.e., inverted, same size) image of the patterns defined by reticle 412 on substrate 416 (as represented in above discussed FIG. 3a).

The following Table 1 lists illustrative optical design criteria for the imaging means shown in FIG. 4a (wherein each of the respective optical surfaces in FIG. 4a, except for the fold-mirror surfaces, is identified by a reference number within parentheses in FIG. 4a). This optical design criteria (which ignores the presence of the fold mirrors), operates with light centered at a wavelength of 365 nanometers (nm) to provide a 0.1 numerical aperture fixed −1X projection system:

In Table 1, the axial separation 113.685329 mm represents the sum of the vertical axial distance between the lower surface (3) of reticle protective window 414 and fold-mirror surface 400T and the horizontal axial distance between fold-mirror surface 400T and the left surface (4) of lens 404-1, as well as the sum of the vertical axial distance between the upper surface (14) of substrate protective window 418 and fold-mirror surface 400B and the horizontal axial distance between fold-mirror surface 400B and the left-surface (15) of lens 404-1.

The imaging means shown in FIG. 4a, employing the illustrative optical design criteria listed in Table 1 is capable of providing a resolution of better than 3 micrometers (mm); and, therefore, is capable of imaging fine patterns (such as needed for the manufacture of the majority of high resolution flat display panels) in a single complete scanning cycle without requiring any field stitching.

Further, the design of the imaging means shown in FIG. 4a has the following desirable characteristics:

1. The use of single triangular fold-mirror element 400 to provide both top and bottom fold-mirror surfaces 400T and 400B, instead of employing two separate prisms for these purposes, makes not only the lens assembly but also the final imaging means adjustments much easier. In order to make the scanning mechanism simple, a mirror bar folds horizontal light paths to vertical directions. Further, the folding of the direction of the light from the reticle from vertical to horizontal and the folding of the light to the substrate from horizontal to vertical permits a simplified scanning mechanism to be employed; however this orientation makes the total footprint of the tool rather large and it necessitates that the substrate be handled in the horizontal position. In some situations it is likely that the preferred embodiment will rotate the reticle and wafer planes so that they are vertical while retaining a horizontal axis for the scanning stage.

2. The imaging means design has a large enough working distance to allow reticle and substrate protective windows 414 and 416 to be installed, which not only provide a means to seal and protect the imaging system but also can be used for magnification correction. Bending these windows about the Y-axis changes the magnification in the X-direction. The magnification can be independently changed in the Y-direction by differentially moving the reticle with respect to the substrate in the Y-direction as the reticle and substrate are being scanned. Some control-of the magnification (+/−30 ppm) is desirable to compensate for small changes in the scale of the substrate as compressive and tensile layers are added during successive process steps.

3. The design adds the two lenses 404-3 and 404-4 to the conventional Wynne-Dyson design to reduce aberrations and telecentricity errors across the large light field of 45×300 mm². Lens 404-3, closer to the doublet lenses 404-1 and 404-2, has a positive power and lens 404-4, further from the doublet lenses 404-1 and 404-2, has a negative power.

It is important that the large object field of 45 mm×300 mm be provided with substantially uniform illumination. While providing uniform illumination over such a wide field is challenging, it can be achieved by employing the light guiding technology using multiple lightpipes that is taught in the aforementioned U.S. Pat. No. 5,852,693, which teaching has been incorporated herein by reference. The light pipes provide a means of obtaining uniform illumination over a field equivalent to 100 mm by 135 mm, which can then be divided into 6 fields, each 45 mm by 50 mm, that can be rearranged to provide a 45 mm by 300 mm field size. In order to conserve material this would likely be done at higher numerical aperture and at a smaller scale, possibly at ⅓ the required scale, and then magnified with a relay to obtain the correct scale at the reticle plane.

The 300 mm wide strip of the image pattern projected on substrate 418 by the imaging means shown in FIG. 4a permits a 550 mm wide substrate to be exposed with the two scans comprising a complete cycle shown in FIG. 3. A little extra field provided by the projection system permits the use of a slit with tapered ends and some overlap between the exposures of the two scans. A 550 mm wide substrate was chosen as an example because this size is believed to be representative of current state-of-the-art flat panel substrates. However the present invention could be scaled up to handle substantially larger substrates For example, a scaled-up projection system could be employed to achieve a span of 380 mm wide field for use in accommodating a 720 mm wide substrate, which is expected to be the next standard substrate size.

Further, it is not intended that the present invention be limited to the above described case in which the movable mask structure and movable substrate structure is situated in a selected one of a plurality of only two indexed, positions. Rather, the present invention contemplates a scanning microlithographic apparatus in which the plurality of selectable indexed positions may be two or greater. In such a case, step 300h in FIG. 3, in which the mask structure is moved right-to-left and the substrate structure is moved left-to-right, is repeated three and possibly more times. In each case the mask structure is moved left-to-right and the substrate structure is moved right-to-left by an identical amount, thereby permitting a new scan to continue until the entire reticle pattern has been copied onto the substrate and a new cycle with a new substrate can commence. In general if more than two scans are required, the re-registration of the reticle and substrate between scans becomes more complex, and the time required for more scans becomes longer.

TABLE 1

| $S_n$ (Surface No.) | Surface Radius-mm | $S_n - S_{n-1}$-mm (Axial Separation) | Lens Glass Type |
| --- | --- | --- | --- |
| (1) & (12) | Infinity | | |
| (2) & (13) | Infinity | 20.000000 | |
| (3) & (14) | Infinity | 10.000000 | BK7_SCHOTT |
| (4) & (15) | Infinity | 113.685329 | |
| (5) | −258.71918 | 152.627197 | FSL5Y_O'HARA |
| (6) | −665.58119 | 132.232497 | PBL6Y_O'HARA |
| (7) | 1513.72957 | 53.185137 | |
| (8) | −2294.93750 | 219.718892 | PBL6Y_O'HARA |
| (9) | 1185.57361 | 100.903748 | |
| (10) | 833.06562 | 73.410281 | PBL6Y_O'HARA |
| (11) | −1400.00000 | 569.305564 | |

What is claimed is:

1. Scanning micro-lithographic apparatus comprising:

a fixed −1X projection system that produces an inverted image in which a vector in an object plane is imaged parallel to itself in one direction, herein defined as the scanning direction, and opposite to itself in the normal direction, herein called the stepping direction, and having a first given width field of view in the stepping direction;

a moveable mask structure on which is mounted a reticle located in said object plane of said projection system, wherein said reticle has a second given width oriented substantially parallel to a first spatial coordinate In the stepping direction and a given length oriented substantially parallel to a second spatial coordinate that is normal to said first coordinate, namely the scanning direction, and wherein said reticle contains patterns that need to be imaged by said projection system over a third width that is large relative to said first given width field of view of said fixed −1X projection system;

a moveable substrate structure on which is mounted a substrate located in an image plane of said projection system on which projected images of said patterns are received;

first means employing radiation, which is traveling substantially parallel to a third spatial coordinate that is normal to the plane defined by said first and second spatial coordinates, for illuminating said reticle over an area, covering a portion of the field of view of the projection system and over the width of the projection system field of view in the stepping direction;

second means for moving said moveable mask structure and reticle in one direction substantially parallel to said first spatial coordinate to any selected one of a given plural number of first fixed index stops thereof, while moving said moveable substrate structure and substrate in an opposite direction substantially parallel to said first spatial coordinate to an index stop of second fixed index stops thereof that corresponds to that selected one of said first fixed index stops with said moveable mask structure and said moveable substrate structure each physically contacting the corresponding fixed index stop with each movement, wherein the movement distance between adjacent ones of said fixed index stops is no greater than the width of the projection system field of view; and third means for scanning said reticle and substrate together in a direction parallel to said second spatial coordinate;

whereby a smaller width of the fixed −1X projection system is rendered capable of imaging, in its entirety, the larger width of a pattern on said reticle by successively scanning said reticle and substrate with each located at corresponding ones of said given plural number of index stops thereof.

2. The scanning microlithographic apparatus defined in claim 1, wherein said scanning and stepping directions are both in a horizontal plane and said reticle and substrate are each also horizontal.

3. The scanning microlithographic apparatus defined in claim 1, wherein said scanning direction is in a horizontal direction and said stepping direction is in a is vertical direction and said reticle and substrate are both in a vertical plane.

4. The scanning microlithographic apparatus defined in claim 1, wherein said scanning direction is in a vertical direction and said stepping direction is in a horizontal direction and said reticle and substrate are both in a vertical plane.

5. The scanning microlithographic apparatus defined in claim 1, wherein said given plural number of first and second fixed index stops is two each.

6. The scanning microlithographic apparatus defined in claim 5, wherein:

said first spatial coordinate is designated as the X spatial coordinate, said second spatial coordinate is designated as the Y spatial coordinate and said third spatial coordinate is designated as the Z spatial coordinate;

said third means comprises a movable carriage structure mounted in a fixed base for scanning movement of said carriage in a direction parallel to said Y spatial coordinate, said carriage structure comprising a first given shaped top portion and a second given shaped bottom portion, wherein each of said first and second given shaped portions includes left and right interior edges that form said index stops and said first given shape top portion also includes a central aperture therethrough to permit the passage of illumination;

said movable mask structure, incorporating said reticle, which mask structure is supported by said first given shaped top portion of said carriage structure in an X, Y spatial plane for movement of said reticle and mask structure in a direction parallel to said X spatial coordinate from a first of said two index stops in which said mask structure is in contact with said left interior edge of said first given shaped top portion to a second of said two index stops in which said mask structure is in contact with said right interior edge of said first given shaped top portion;

said movable substrate structure, incorporating said substrate, which substrate structure is supported by said second given shaped bottom portion of said carriage structure in an X, Y spatial plane for movement of said substrate structure from a first of said two index stops in which said substrate structure is in contact with said left interior edge of said second given shaped bottom portion to a second of said two index stops in which said substrate structure is in contact with said right interior edge of said second given shaped bottom portion; and said fixed −1X projection system is spatially located in between said mask and substrate structures to image on said substrate those reticle patterns illuminated by light traveling parallel to said Z spatial coordinate that reaches said fixed −1X projection system after passing through said central aperture of said top portion of said carriage structure when said mask and substrate structures are in contact with the first of their two index stops or, alternatively, when said mask and substrate structures are in contact with the second of their two index stops.

7. The scanning microlithographic apparatus defined in claim 6, wherein:

said left and right interior edges of said carriage structure are substantially parallel to one another;

each of said index stops includes a plurality of surfaces that collectively define an index position;

said second means employs air bearings for effecting the support of said movable mask structure by said first given shaped top portion of said carriage structure in its X, Y spatial plane;

said movable mask structure comprises a mask holder for holding said reticle;

said mask holder comprises a first set of three separate prominences which provide the sole contact with said left interior edge and another interior edge of said carriage structure when said mask structure occupies a first indexed position to thereby determine a first given angular orientation for said mask structure in its X, Y spatial plane; and said mask holder further comprises a second set of three separate prominences which provide the sole contact with said right interior edge and said other interior edge of said carriage structure when said mask structure occupies a second indexed position to thereby also determine a second angular orientation for said mask structure in its X, Y spatial plane.

8. The scanning microlithographic apparatus defined in claim 6, wherein:

said area on said reticle that is illuminated has a length and a width each of which is oriented in said X, Y spatial plane;

said length is parallel to said Y spatial coordinate and said width is parallel to said X spatial coordinate; and the length is small relative to the width.

9. The scanning microlithographic apparatus defined in claim 8, wherein:

the combination of said reticle, said fixed −1X projection system having said first given width field of view and said substrate comprise imaging means for deriving an image on said substrate; and said fixed −1X projection system having said first given width field of view comprises a wide-field catadioptric projection system.

10. The scanning microlithographic apparatus defined in claim 8, wherein:
   the design of said wide-field catadioptric projection system constitutes a modified Wynne-Dyson relay comprising:
      first and second fold mirror surfaces oriented at +45 degrees and at −45 degrees with respect to the optical axis through the refractive components and arranged so that the object and image planes are opposed and parallel to one another; and
      a concave mirror surface and a plurality of lenses spatially disposed along an optical axis in respective positions to focus and correct the aberrations of light traveling from said reticle via the first fold-mirror through the lenses to the concave mirror and after reflection back through the lenses to the second fold mirror and then to the image plane on the substrate.

11. The scanning microlithographic apparatus defined in claim 10, wherein said design of said wide-field catadioptric projection system further comprises:
   a triangular fold-mirror element having:
      an upper mirror surface oriented at substantially a 45 degree angle with respect to each of said Y and Z spatial coordinates with said upper mirror surface constituting said first fold mirror surface; and
      a lower mirror surface oriented at substantially a 45 degree angle with respect to each of said Y and Z spatial coordinates with said lower mirror surface constituting said second fold mirror surface.

12. The scanning microlithographic apparatus defined in claim 10, wherein said plurality of lenses of said modified Wynne-Dyson relay comprises a doublet consisting of first and second lenses, a third lens and a fourth lens, wherein:
   said first and second lenses form a doublet that is situated closest to said first and second fold mirror surfaces, and;
   said third lens, which is spaced a first given distance with respect to said doublet in a direction parallel to said Y spatial coordinate toward said concave mirror surface and has a positive power, together with said fourth lens which is spaced a second given distance with respect to said third lens in a direction parallel to said Y spatial coordinate further toward said concave mirror surface and is a meniscus element, to reduce aberrations and telecentricity errors across a large image field derived by said design of said wide-field catadioptric projection system.

13. The scanning microlithographic apparatus defined in claim 12, wherein:
   said area on said reticle that is illuminated is offset with respect to the folded position of the optical axis to avoid vignetting over the field; and
   the periphery of each of said plurality of lenses has been shaped to be narrow in the scanning direction and wide in the stepping direction this leaving sufficient aperture to image a wide-field without vignetting and to eliminate any interference with extensions of the parallel object and image planes that would interfere with scanning said reticle and substrate.

14. The scanning microlithographic apparatus defined in claim 13, wherein each of said plurality of lenses is derived from a lens originally having a circular periphery diameter value equal to said width of the area on said reticle that is illuminated from which respective top and bottom portions extending in the direction of the folded focal plane positions have been removed to eliminate interference with said reticle and substrate and their scanning mechanisms.

15. An imaging means suitable for use in scanning microlithographic apparatus, wherein said imaging means comprises:
   a fixed −1X projection system having a first width field of view substantially parallel to an X spatial coordinate of an X, Y horizontal plane for imaging patterns defined by a reticle located in an object plane of said projection system on a substrate located in an image plane of said projection system;
   first means employing light, which is traveling substantially parallel to a vertical Z spatial coordinate, for illuminating said reticle over a fixed area, said fixed area having a second width parallel to said X coordinate which is no greater than the size of said first width of said field of view of said fixed −1X projection system and having a length parallel to said Y spatial coordinate that is small relative to said second width; and
   said fixed −1X projection system comprises a modified Wynne-Dyson relay wide-field catadioptric projection system incorporating:
      a triangular fold mirror element having an upper mirror surface oriented at substantially a 45 degree angle with respect to each of said Y and Z spacial coordinates that constitutes a first fold mirror surface and having a lower mirror surface oriented at substantially a 45 degree angle with respect to each of said Y and Z spacial coordinates that constitutes a second fold mirror surface, said first fold mirror surface is spatially disposed in a position to convert reticle-pattern light traveling parallel to said Z spatial coordinate that reaches said projection system and is incident on said first fold mirror surface into reticle-pattern light traveling in one direction parallel to said Y spatial coordinate; and
      a concave mirror surface and a plurality of lenses spatially disposed along an optical axis in respective positions to focus said reticle-pattern light traveling in said one direction parallel to said Y spatial coordinate through said lenses onto said concave mirror surface to thereby reflect, from said concave mirror surface, reticle-pattern light traveling in an opposite direction parallel to said Y spatial coordinate that passes back through said lenses to said second fold mirror surface of said triangular fold mirror element;
   wherein said second fold mirror surface converts the incident reflected light incident thereon into reticle-pattern light traveling parallel to said Z spatial coordinate toward said substrate.

16. The imaging means defined in claim 15, wherein said plurality of lenses of said modified Wynne-Dyson relay comprises:
   a doublet consisting of first and second lenses that are situated closest to said first and second fold mirror surfaces;
   a third lens spaced a first given distance with respect to said doublet in a direction parallel to said Y spatial coordinate toward said concave mirror surface; and
   a fourth lens spaced a second given distance with respect to said third lens in a direction parallel to said Y spatial coordinate further toward said concave mirror surface and is a meniscus element;
   wherein said third lens, has a positive power, together with said fourth lens;
   wherein said first, second, third and fourth lenses reduce aberrations and telecentricity errors across a large light image field derived by said design of said long-field catadioptric projection system.

17. The imaging means defined in claim 16, wherein:
said reticle illuminated area is offset with respect to the folded position of the optical axis to avoid any vignetting over the field; and
the periphery of each of said plurality of lenses being shaped to be narrow in the scanning direction and wide in the stepping direction leaving sufficient aperture to Image the wide-field without vignetting and to eliminate any interference with extensions of the parallel object and image planes that would interfere with scanning said reticle and substrate.

18. The imaging means defined in claim 17, wherein each of said plurality of lenses is derived from a lens originally having a circular periphery diameter value equal to said given width size from which respective top and bottom portions extending in the direction of the folded focal plane positions have been removed to eliminate interference with said reticle and substrate and their scanning mechanisms.

19. The imaging means defined in claim 17, wherein said reticle and said substrate are so disposed within a carriage structure that permits them to be scanned together in a direction substantially parallel to said Y coordinate.

20. An imaging means suitable for use In scanning microlithographic apparatus, wherein said imaging means comprises:
a fixed −1X projection system having a first width field of view substantially parallel to an X spatial coordinate of an X, Y horizontal plane for imaging patterns defined by a reticle located in an object plane of said projection system on a substrate located in an image plane of said projection system;
first means employing light, which is traveling substantially parallel to a vertical Z spatial coordinate, for illuminating said reticle over a fixed area, said fixed area having a second width parallel to said X coordinate which is no greater than the size of said first width of said field of view of said fixed −1X projection system and having a length parallel to said Y spatial coordinate that is small relative to said second width; and
said fixed −1X projection comprises a modified Wynne-Dyson relay wide-field catadioptric projection system incorporating:
a first fold mirror surface spatially disposed in a position to convert said reticle-pattern light traveling parallel to said Z spatial coordinate that reaches said projection system and is incident on said first fold mirror surface into reticle-pattern light traveling in one direction parallel to said Y spatial coordinate;
a concave mirror surface and a plurality of lenses spatially disposed along an optical axis in respective positions to focus said reticle-pattern light traveling in said one direction parallel to said Y spatial coordinate through said lenses onto said concave mirror surface to thereby reflect, from said concave mirror surface, reticle-pattern light traveling in an opposite direction parallel to said Y spatial coordinate that passes back through said lenses; and
a second fold mirror surface spatially disposed in a position to have said passed-back reticle-pattern reflected light incident thereon and then convert this incident reflected light into reticle-pattern light traveling parallel to said Z spatial coordinate toward said substrate;
wherein said plurality of lenses include:
a doublet consisting of first and second lenses that are situated closest to said first and second fold mirror surfaces;
a third lens spaced a first given distance with respect to said doublet in a direction parallel to said Y spacial coordinate toward said concave mirror surface; and
a fourth lens is a meniscus element spaced a second given distance with respect to said third lens in a direction parallel to said Y spatial coordinate further toward said concave mirror surface;
wherein said third lens and has a positive power, together with said fourth lens;
wherein said first, second, third and fourth lenses together reduce aberrations and telecentricity errors across a large light image field derived by said design of said long field catadioptric projection system.

21. The imaging means defined in claim 20, wherein said first and second fold mirrors are an upper and a lower surface, respectively, of a triangular fold-mirror element having said upper mirror surface oriented at substantially a 45 degree angle with respect to each of said Y and Z spatial coordinates and having said lower mirror surface oriented at substantially a 45 degree angle with respect to each of said Y and Z spatial coordinates.

22. The imaging means defined in claim 20, wherein:
said reticle illuminated area is offset with respect to the folded position of the optical axis to avoid any vignetting over the field; and
the periphery of each of said plurality of lenses being shaped to be narrow in the scanning direction and wide in the stepping direction leaving sufficient aperture to image the wide-field without vignetting and to eliminate any interference with extensions of the parallel object and image planes that would interfere with scanning said reticle and substrate.

23. The imaging means defined in claim 22, wherein each of said plurality of lenses is derived from a lens originally having a circular periphery diameter value equal to said given width size from which respective top and bottom portions extending in the direction of the folded focal plane positions have been removed to eliminate interference with said reticle and substrate and their scanning mechanisms.

24. The imaging means defined in claim 22, wherein said reticle and said substrate are so disposed within a carriage structure that permits them to be scanned together in a direction substantially parallel to said Y coordinate.

* * * * *